United States Patent
Kawashima

[11] Patent Number: 5,871,582
[45] Date of Patent: Feb. 16, 1999

[54] MELT RECEIVER FOR A SEMICONDUCTOR SINGLE-CRYSTAL MANUFACTURING DEVICE

[75] Inventor: Shigeki Kawashima, Kanagawa, Japan

[73] Assignee: Komatsu Electronic Metals Co., Ltd., Kanagawa, Japan

[21] Appl. No.: 956,286

[22] Filed: Oct. 23, 1997

[30] Foreign Application Priority Data

Oct. 24, 1996 [JP] Japan .................................... 8-299608

[51] Int. Cl.⁶ .................................................. C30B 35/00
[52] U.S. Cl. ............................ 117/213; 117/208; 117/900
[58] Field of Search .................................... 117/208, 213, 117/217, 900, 932; 126/373, 375

[56] References Cited

U.S. PATENT DOCUMENTS

| | | | |
|---|---|---|---|
| 2,977,258 | 3/1961 | Dunkle | 117/33 |
| 3,033,660 | 5/1962 | Okkerse | 117/33 |
| 4,659,421 | 4/1987 | Jewett | 117/31 |
| 4,661,200 | 4/1987 | Sachs | 117/33 |

*Primary Examiner*—Felisa Garrett
*Attorney, Agent, or Firm*—Sughrue, Mion, Zinn, Macpeak & Seas, PLLC

[57] ABSTRACT

This invention provides a melt receiver for a semiconductor single-crystal manufacturing device, which is capable of protecting the main chamber from being damaged by the outflow of the melt or dropping of the debris of the broken crucibles and therefore preventing steam explosion. The melt receiver 1 is consisted of an adiabatic member 3 made of carbon fibers; a cover 2 made of high strength C/C material which shelters the surface of the adiabatic member 3; and a bottom plate 4. A groove 2a is formed on the upper surface of the cover 2. The groove 2a has a size capable of accommodating all of the melt stored in the quartz crucible 7. The melt flown out or articles dropped down due to damage of the crucible are received by the melt receiver 1, and the melt flown out can not reach the bottom of the main chamber 9. The melt receiver can also be consisted of a melt absorption layer made of adiabatic material, and a melt isolation layer made of graphite or high strength C/C material.

9 Claims, 4 Drawing Sheets

MELT RECEIVER FOR A SEMICONDUCTOR SINGLE-CRYSTAL MANUFACTURING DEVICE

BACKGROUND OF THE INVENTION

1. Field of the Invention

This invention relates to a melt receiver for a semiconductor single-crystal manufacturing device.

2. Description of Related Art

The substrate of a semiconductor component is mainly made of single-crystal silicon with high purity. The method for manufacturing single-crystal silicon with high purity is chiefly the Czochralski Method (hereinafter referred as the CZ method). FIG. 5 is a partial schematic cross-sectional view showing an example of a device for manufacturing semiconductor single crystals by the CZ method. As shown in FIG. 5, within the main chamber 9, a graphite crucible 10 is disposed on the upper portion of a crucible axis 5 which is capable of rotating and moving upward or downward. Furthermore, a cylindrical graphite heater 6 and a heat reserving cylinder 13 made of adiabatic material are disposed around the graphite crucible 10. The main chamber 9 constitutes of a container made of two-layer stainless steel. Cooling water is circulated within the space of the two layers of stainless steel so as to keep the temperature within the furnace at a proper value (furnace: chamber providing a crucible, heater and etc.). Furthermore, a melt receiver 14 made of adiabatic material (such as carbon fibers) is installed on the bottom of the main chamber 9. The melt receiver 14 is provided with a hole 14c and a through hole through which an electrode 15 of the graphite heater 6 is inserted. A discharge pipe for expelling SiO gas coming from the melt 8 with carrier gases out of the manufacturing device is inserted through the hole 14c in the melt receiver.

Polycrystal silicon in lumps is fed into a quartz crucible 7 accommodated within a graphite crucible 10 and heated by the graphite heater 6 to be melted into melt 8. A seed crystal installed within a seed chuck 16 is dipped into melt 8. Then, the seed chuck 16 and the graphite crucible 10 are driven to rotate in the same or opposite directions, and at the same time the seed chuck 16 is lifted to grow a silicon single crystal 17. The parts such as the quartz crucible 7, the graphite crucible 10, and the graphite heater 6 are designed based on the temperature distribution within the furnace and the heat history of the silicon single crystal 17. However, it does not mean that everything is taken into consideration when melt 8 is solidified due to an unforeseen trouble during lifting of silicon single crystal. The solidification of the melt 8 will cause damage to the quartz crucible 7 due to expansion of the volume of the melt 8 and consequently bring about outflow of the melt 8. Under such a circumstance, the melt receiver 14 is not of the structure capable of absorbing all of the melt 8. Furthermore, it is neither of the structure capable of preventing damage to the bottom of the main chamber, which damage is induced by dropping of the broken quartz crucible or the broken graphite crucible. If the outflow of the melt 8 or drop of the debris of the broken quartz crucible or the broken graphite crucible impairs the bottom of the main chamber, there exists a danger that the cooling water circulating within the walls of the main chamber will cause a steam explosion.

SUMMARY OF THE INVENTION

In view of the above defects, the object of the present invention is to provide a melt receiver for a semiconductor single-crystal manufacturing device. The melt receiver according to this invention is capable of protecting the main chamber from being damaged by the outflow of the melt or dropping of the debris of the broken crucibles and therefore preventing steam explosion.

To achieve the above object, the melt receiver for a semiconductor single-crystal manufacturing device according to this invention is a melt receiver installed on the bottom of the main chamber of an equipment for manufacturing semiconductor single-crystal by the CZ method. The melt receiver is characterized in that it comprises an adiabatic member; a sheath consisting of a cover and a bottom plate, the cover being made of carbon complex material reinforced with high strength carbon fibers for protecting the main chamber from being damaged by the heavy broken crucibles that had deposited the melt and used for shielding the outer surface of the adiabatic member, the upper surface of the cover being provided with a ring-shaped groove for receiving outflow of the melt and the dropped article e.g. debris of the crucibles.

Furthermore, the melt receiver for a semiconductor single-crystal manufacturing device according to this invention is a melt receiver installed at the bottom of the main chamber of the equipment for manufacturing semiconductor single-crystal by the CZ method. The melt receiver which comprises a melt absorption layer made of adiabatic material, and a melt isolation member made of graphite or carbon complex material reinforced with high strength carbon fibers will work out well.

Furthermore, the melt receiver is characterized in that it is capable of depositing or absorbing all of the melt stored in the crucible.

According to the above first measure, the surface of the adiabatic member that has been used as a melt receiver is covered with carbon complex material reinforced with high strength carbon fibers. Therefore, even if a heavy crucible breaks down due to the solidification and expansion of the melt and drops down, the cover is capable of receiving dropped articles and will not be impaired. Furthermore, following the breakage of the crucible, the melt flown out will enter the ring shaped groove formed on the upper surface of the cover and will not reach the bottom of the main chamber.

Furthermore, according to the above second measure, following the breakage of the crucible, the melt absorption layer made of adiabatic material will absorb the melt flown out, and the melt isolation member will catch the melt passing through the melt absorption layer and dropped articles induced by the breakage. Therefore, the damage of the bottom of the main chamber can be prevented.

In addition, if a melt receiver capable of depositing or absorbing all of the melt stored in the crucible is used, the outflow melt can entirely be prevented from reaching the bottom of the main chamber.

BRIEF DESCRIPTION OF THE DRAWINGS

The present invention can be more fully understood by reading the subsequent detailed description and examples with references made to the accompanying drawings, wherein.

DETAILED DESCRIPTION OF THE PREFERRED EMBODIMENT

Figure 1:
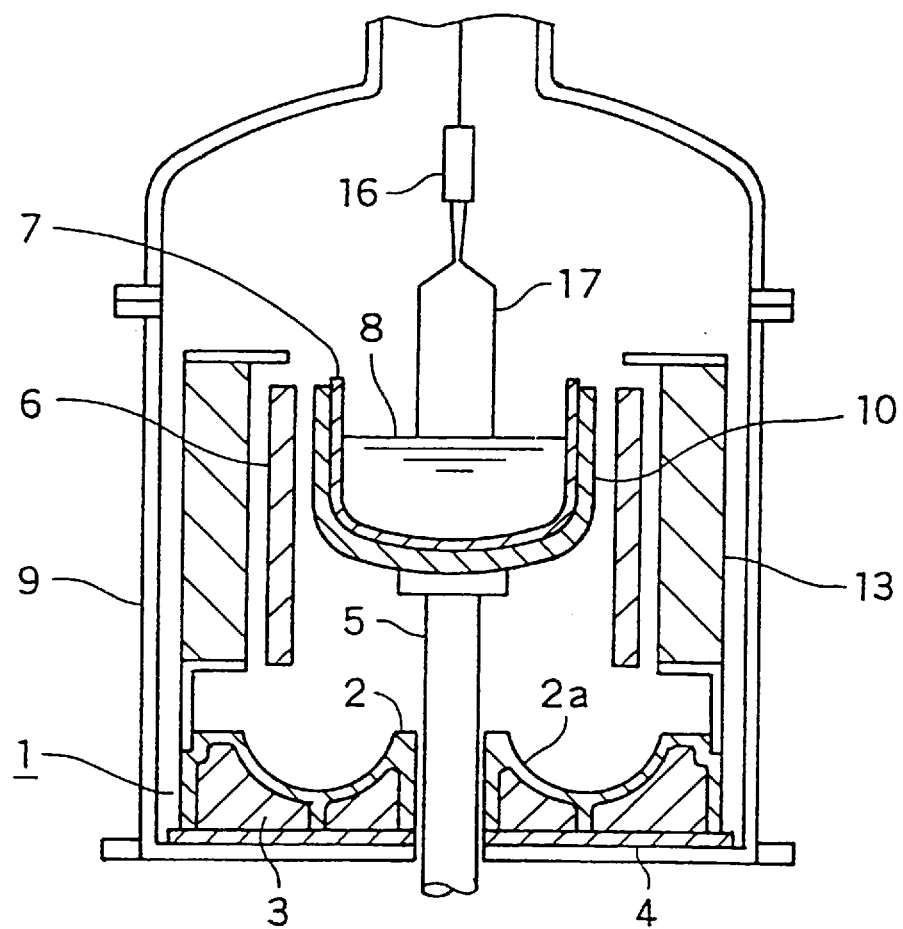
FIG. 1 is a partial cross sectional view schematically showing the structure of a semiconductor single-crystal manufacturing device equipped with the first embodiment of the melt receiver according to this invention.
Figure 2:
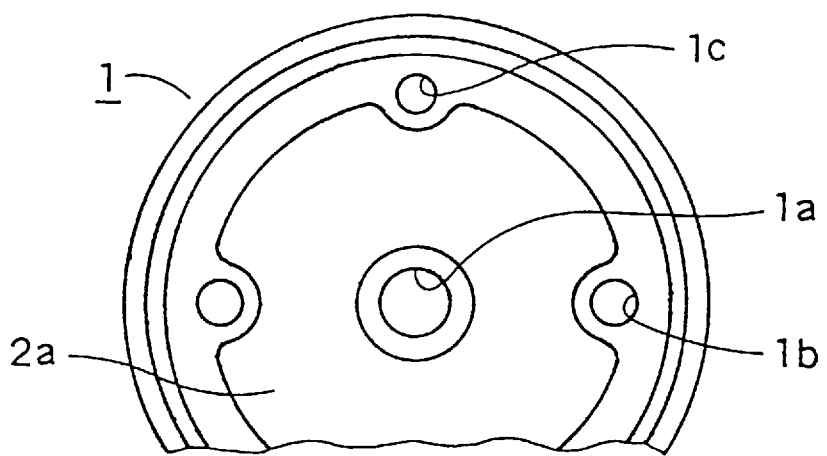
FIG. 2 is a partial top view of the melt receiver shown in FIG. 1.

The description of embodiments of the melt receiver according to this invention will be made hereinafter with references to the accompanying drawings. FIG. 1 is a partial cross sectional view schematically showing the structure of a semiconductor single-crystal manufacturing device equipped with the first embodiment of the melt receiver according to this invention. FIG. 2 is a partial top view of the melt receiver shown in FIG. 1. The members as described in the prior art are designated the same numerals and hence their description is omitted.

The first embodiment of the melt receiver is designed for a large-scaled semiconductor single-crystal manufacturing device that is put to use following the enlargement of the diameters of semiconductor single crystals produced by the CZ method, and the capacity of the crucible of the first embodiment is set to be over 100 Kg. The melt receiver 1 is consisted of a cylindrical cover 2 made of carbon complex material reinforced with high strength carbon fibers (hereinafter referred as C/C material); an adiabatic member 3 made of carbon fibers that are filled within the cylindrical cover 2; and a bottom plate 4 for supporting the cylindrical cover 2. The bottom plate 4 is made of high strength C/C material or solid material. A crucible axis 5 inserts through a hole 1a formed in the central portion of the bottom plate 4. Two holes 1b, 1c are respectively formed in predetermined locations. The electrode of the graphite heater 6 inserts through the hole 1b, and a discharge pipe for expelling gases inserts through the hole 1c. Furthermore, a groove 2a having an arc-shaped cross section and surrounding the hole 1a is formed on the upper surface of the cover 2. The groove 2a is in a size capable of accommodating all of the melt stored in the quartz crucible 7.

The adiabatic member that has been used as a melt receiver is covered with C/C material and used as the melt receiver of this invention. Therefore, when outflow of the melt occurs, the melt receiver according to this invention can receive all of the melt flown out without any damage and the melt will not reach the bottom surface of the main chamber 9. Furthermore, even if the quartz crucible 7 and the graphite crucible 10 break down due to the solidification and expansion of the melt and the debris of the crucibles and solidified liquid drop down, the cover has a strength enough for receiving the shock. Therefore, dropped articles can be stopped at the top surface of the cover 2. Thus, the bottom surface of the main chamber 9 will not be impaired.

Figure 3A:
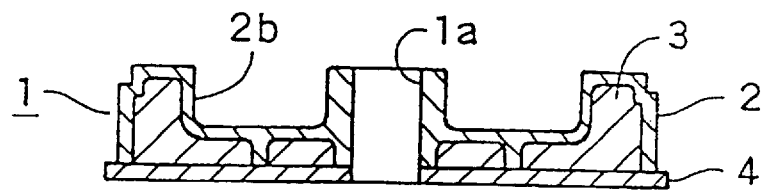
FIGS. 3(a), 3(b), 3(c), and 3(d) are cross sectional views respectively showing four kinds of the melt receivers with different groove shapes.
Figure 3B:
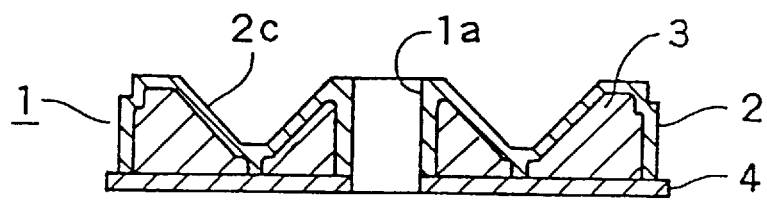
Figure 3C:
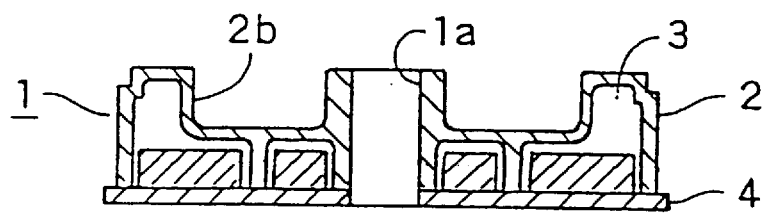
Figure 3D:
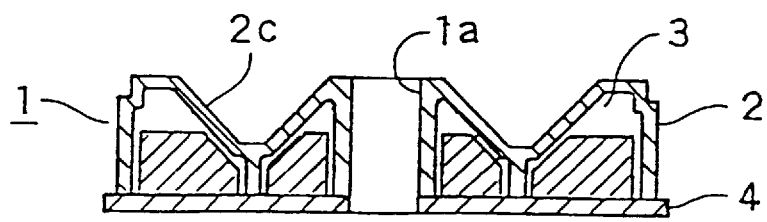

FIGS. 3(a), 3(b), 3(c), and 3(d) are cross sectional views respectively showing four kinds of the melt receivers with different groove shapes from that shown in FIG. 1. FIG. 3(a) shows a melt receiver 1 having a rectangular-sectional shaped groove 2b formed on the top surface of the cover 2. FIG. 3(b) shows a melt receiver 1 having a "V"-sectional shaped groove 2c formed on the top surface of the cover 2. Both of the grooves 2b, and 2c are of a size capable of accommodating all of the melt stored in the quartz crucible. The structures other than the grooves 2b, and 2c of the melt receiver 1 are the same as those of the melt receiver as shown in FIGS. 1 and 2, therefore there is no hindrance to dispose the melt receiver of this invention in a conventional semiconductor single-crystal manufacturing device. It works out fine if carbon fibers are filled into the groove to absorb melt. Furthermore, the covers 2 and the bottom plates 4 of the melt receivers as shown in FIGS. 1, 3(a), 3(b) can also be integrally formed. Also, as shown in FIGS. 3(c), 3(d), it works out fine if the groove is shaped like any one shown in FIGS. 1, 2, 3(a), and 3(b), an adiabatic member 3 made of carbon fibers is disposed on the bottom plate 4, and the cover 2 is laid over the bottom plate 4 to accommodate the adiabatic member 3 therein. By this arrangement, it is very easy to improve conventional semiconductor single-crystal manufacturing device by only adding the cover 2 to the conventional structure.

Figure 4A:
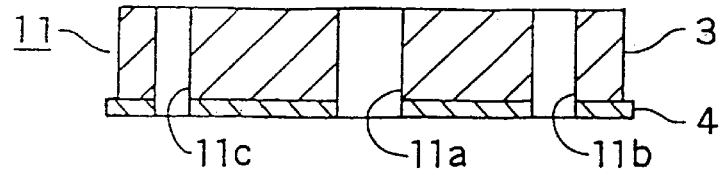
FIGS. 4(a), 4(b) are cross sectional views respectively showing two examples of the second embodiment of the melt receiver according to this invention.
Figure 4B:
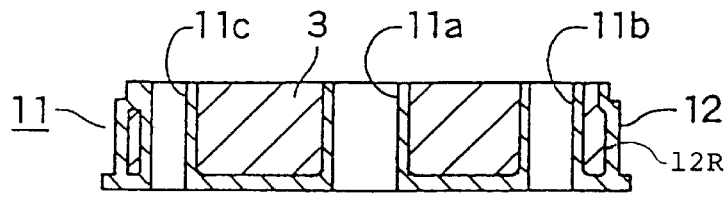
Figure 5:
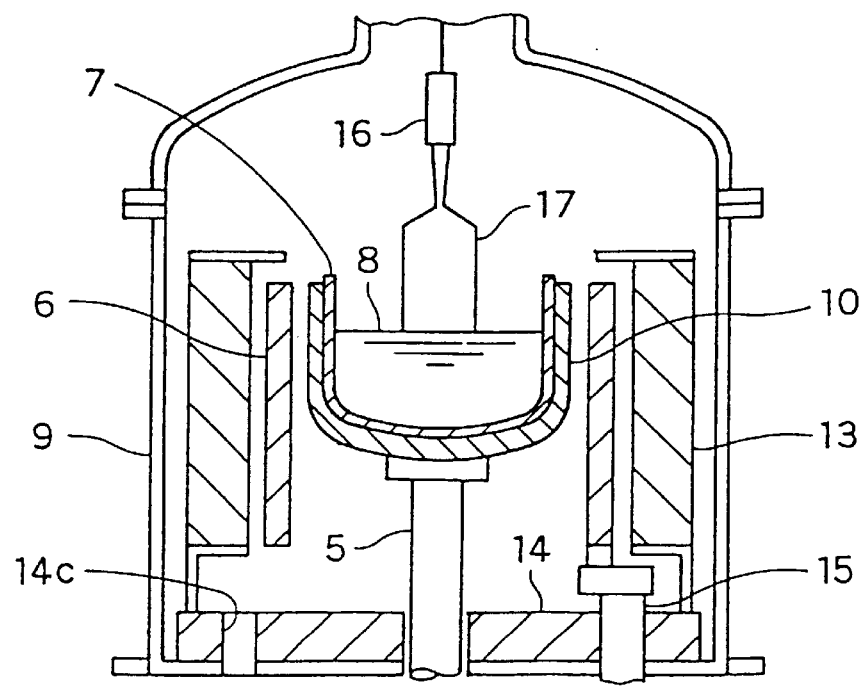
FIG. 5 is a partial cross sectional view schematically showing the structure of a semiconductor single-crystal manufacturing device equipped with a conventional melt receiver.

FIGS. 4(a), 4(b) are cross sectional views respectively showing two examples for the second embodiment of the melt receiver according to this invention. The second embodiment of the melt receiver is designed for the crucible having a capacity of 100 kg. The melt receiver 11 as shown in FIG. 4(a) is of a two-layer structure. The upper layer is an adiabatic member 3 made of carbon fibers that are used for absorbing all of the melt flown out. The lower layer is a bottom plate 4 made of graphite sheet or high strength C/C material that is used for isolating the melt passing through the adiabatic member 3. A crucible axis inserts through a hole 11a formed in the central portion of the melt receiver 11. Two holes 11b, 11c are respectively formed in predetermined locations. The electrode of the graphite heater inserts through the hole 11b, and a discharge pipe for expelling gases inserts through the hole 11c.

As shown in FIG. 4(b), the melt receiver 11 may be constructed that the adiabatic member 3 is accommodated within a recess 12R of a melt isolation case 12 made of graphite material or high strength C/C material. On this occasion, the melt passing through the adiabatic member 3 is stored in the recess 12R of the melt isolation case 12. Therefore, the bottom of the main chamber can be protected more exactly. Moreover, the bottom of the main chamber is hard to be impaired even if a heavy article drops down.

In a semiconductor single-crystal manufacturing device provided with a melt receiver 11 capable of absorbing 80 kg melt, the crucible storing 75 kg melt broke down and approximately 50 kg melt flew out. However, all of the melt flown out was nearly absorbed by the melt receiver 11, and the melt flown out did not reach the bottom of the main chamber.

As described above, the melt receiver according to this invention is constructed in such a way that the adiabatic member is sheltered by the cover made of high strength C/C material and the melt being flown out and entering the groove formed in the top surface of the cover can be absorbed. Alternatively, the melt receiver comprises an absorption layer for absorbing the melt flown out and a melt isolation layer. Therefore, the melt receiver is prominent in its endurance to shock and its adiabatic ability. In the case of using such a melt receiver, even if a heavy article drops down due to breakage of the crucible, the melt receiver can receive the dropped article and prevent damage of the bottom of the main chamber. Therefore, even if following the enlargement of the diameters of semiconductor single crystals produced by the CZ method, the scale of the products becomes larger, the safety of the semiconductor single-crystal manufacturing device can still be enhanced.

What is claimed is:

1. A melt receiver installed at the bottom of the main chamber of an apparatus for manufacturing semiconductor single-crystal by the CZ method, comprising:

a melt absorption layer made of adiabatic material; and a melt isolation member made of a material comprising at least one of graphite and carbon complex material reinforced with high strength carbon fibers.

2. The melt receiver as claimed in claim 1, wherein the melt receiver is acceptable for all of the melt stored in the crucible.

3. A melt receiver installed at the bottom of the main chamber of an apparatus for manufacturing semiconductor single-crystal by the CZ method, comprising:

an adiabatic member; and a sheath for protecting the main chamber from being damaged by the heavy broken crucible, wherein the sheath comprises a cover and a bottom plate, the cover being made of carbon complex material reinforced with high strength carbon fibers and used for shielding the outer surface of the adiabatic member, the upper surface of the cover being provided with a ring shaped groove for receiving outflow of the melt and a dropped article.

4. The melt receiver as claimed in claim 3, wherein the bottom plate and the cover are fixed together.

5. The melt receiver as claimed in claim 3, wherein the cover is located on a bottom of the main chamber.

6. The melt receiver as claimed in claim 3, wherein the cover is disposed on a bottom of the main chamber so as to cover the adiabatic member on the bottom of the main chamber.

7. The melt receiver as claimed in claim 3, wherein the groove has a rectangular-sectional shape.

8. The melt receiver as claimed in claim 3, wherein the groove has a V sectional shape.

9. The melt receiver as claimed in claim 3, wherein the melt receiver is acceptable for all of the melt stored in the crucible.

* * * * *